United States Patent
Urai

Patent Number: 5,484,742
Date of Patent: Jan. 16, 1996

[54] PROCESS FOR PREPARING A SEMICONDUCTOR DEVICE WITH A NARROW-CHANNEL MOS TRANSISTOR

[75] Inventor: Takahiko Urai, Tokyo, Japan

[73] Assignee: NEC Corporation, Tokyo, Japan

[21] Appl. No.: 957,861

[22] Filed: Oct. 8, 1992

[30] Foreign Application Priority Data

Oct. 8, 1991 [JP] Japan ................................ 3-260215

[51] Int. Cl.⁶ .................................................. H01L 21/265
[52] U.S. Cl. .............................. 437/44; 437/29; 437/69; 437/36
[58] Field of Search .................... 437/69, 44, 70, 437/29, 56

[56] References Cited

U.S. PATENT DOCUMENTS

| | | | |
|---|---|---|---|
| 4,749,662 | 6/1988 | Custode et al. | 437/70 |
| 5,132,241 | 7/1992 | Su | 437/70 |
| 5,183,773 | 2/1993 | Miyata | 437/52 |
| 5,242,841 | 9/1993 | Smayling et al. | 437/44 |

FOREIGN PATENT DOCUMENTS

| | | | |
|---|---|---|---|
| 57-39551 | 3/1982 | Japan | 437/70 |
| 1-120033 | 5/1985 | Japan | 437/70 |
| 62-48028 | 3/1987 | Japan | 437/70 |
| 4-98850 | 3/1992 | Japan | 437/69 |

*Primary Examiner*—Olik Chaudhuri
*Assistant Examiner*—H. Jey Tsai
*Attorney, Agent, or Firm*—Burns, Doane, Swecker & Mathis

[57] ABSTRACT

A second photo-resist film 6a is formed on first photo-resist film 5a which functions as a mask for etching an oxidation resistant silicon nitride film 3 in a region in which a narrow-channel MOS transistor is to be formed. Ions having p-type are implanted into the surface of a substrate 1 using the first photo-resist film 5a and the second photo-resist film 6a as the masking, to selectively form a p-type ion-implanted layer 7. Then, with heating process, a channel stopper 9a and field oxidation layers 8 are formed, whereby element forming regions partitioned by the field oxidation layers 8 are provided. In this manner, it is possible, at least in the region in which the narrow-channel MOS transistor is to be formed, that the channel stopper is prevented from spreading into the channel region and thereby the reduction of the channel width is prevented.

5 Claims, 4 Drawing Sheets

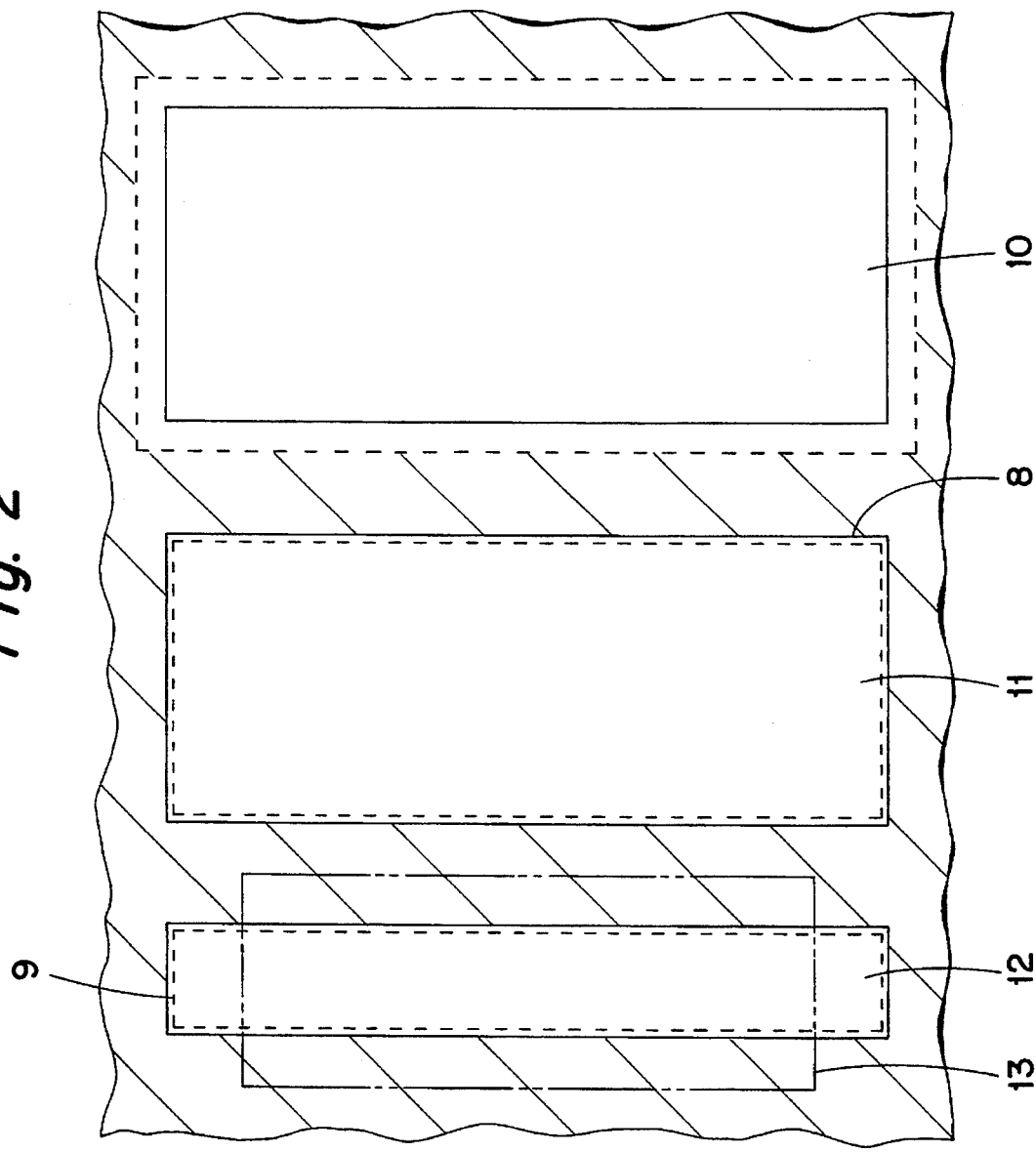

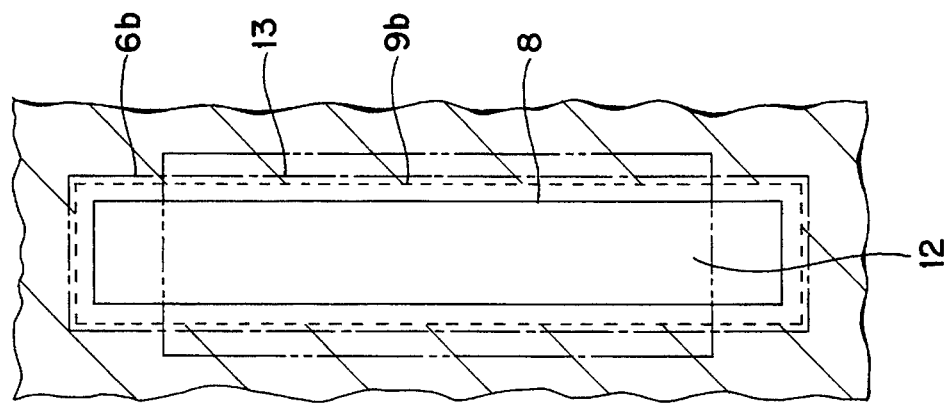
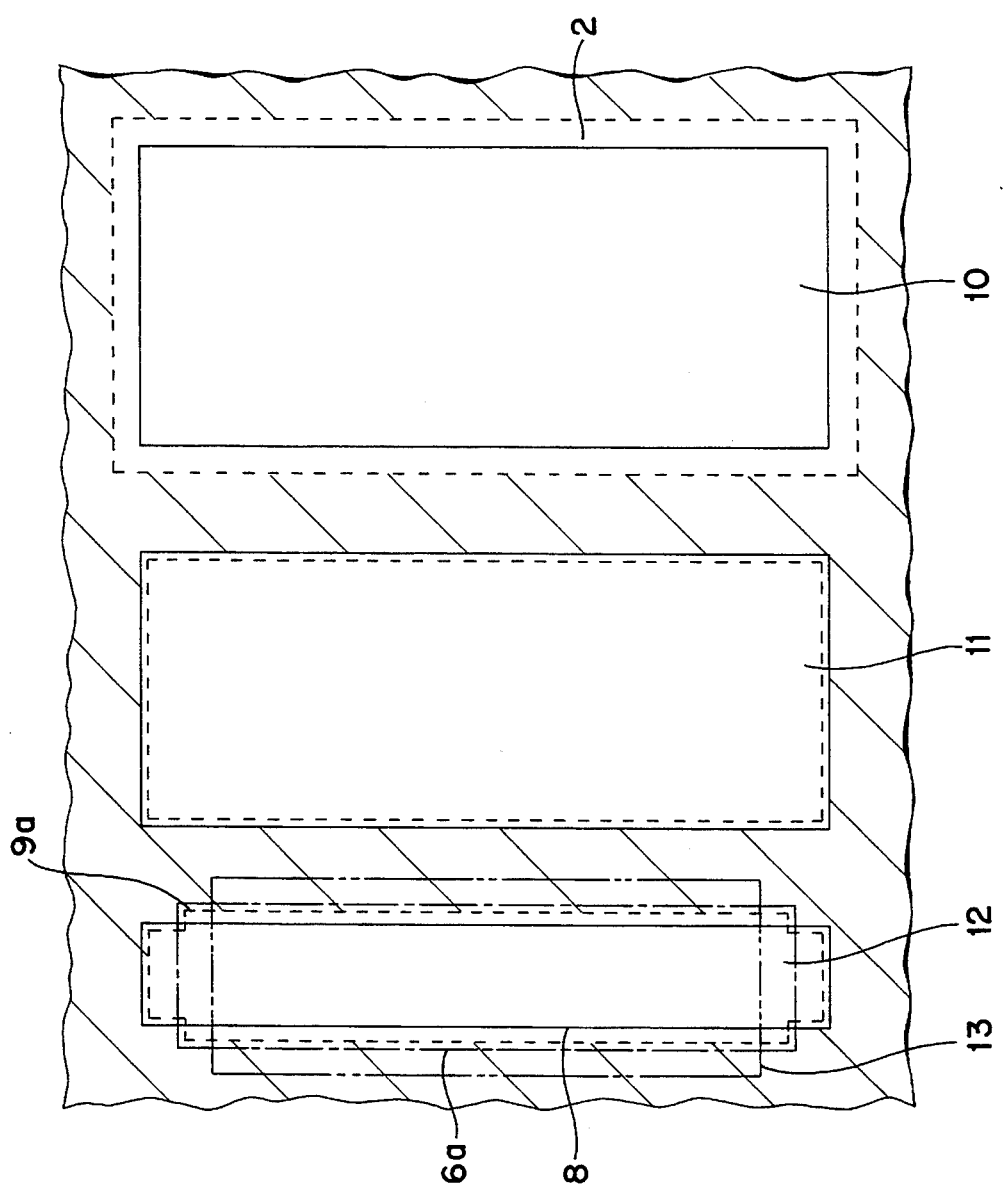

PROCESS FOR PREPARING A SEMICONDUCTOR DEVICE WITH A NARROW-CHANNEL MOS TRANSISTOR

BACKGROUND OF THE INVENTION

The present invention relates to a process for preparing a semiconductor device with a narrow-channel MOS transistor, and more particularly to a method of forming a channel stopper by ion implantation.

In recent years, semiconductor devices show a tendency to make the capacity and integration increased, and with this, the devices have been promoted to be microminiaturized and to have multi-functions and variations. Under such circumstances, in a technical view point of manufacturing MOS transistors, a reduction of the channel length has been promoted for the former reason, or microminiaturizing whereas a lot of types of transistors which realize various functions have been developed for the latter or the multi functions.

Of these various MOS transistors, there is one type of the transistor which channel is small in width (so called as a narrow-channel transistor). The narrow-channel transistors have been prepared conventionally in the same manner as for preparing normal MOS transistors.

Now, the process for preparing a conventional narrow-channel transistor will be described with paying particular attention to the forming steps of preparing an oxide layer for element separation (field oxide layer) and a channel stopper in an n-MOS transistor.

In a step shown in FIG. 1A, there is provided, for example, a p-type silicon substrate 1 on which an oxide silicon layer 3 is formed, and an n-well 2 is selectively formed in the surface layer of the silicon substrate 1. In order to form an element separation insulating layer on the surface of the silicon substrate 1 provided with the selective n-well 2, silicon nitride film (an oxidation resistant film) 4 is formed on the entire surface. Thereafter, a first photo-resist film 5 is applied on the whole surface, then the first resist film 5 (5a, 5b and 5c) is selectively exposed using a resist mask for forming the element separation insulating layers. Subsequently the first resist film 5 is developed to remove the photo-resist film 5 from the places where the element separation insulating layer is to be formed. Thus the photo-resist film sections 5a, 5b and 5c are patterned. Then with the masking of the photo-resist film sections 5a, 5b and 5c, the plasma etching is effected to selectively remove the silicon nitride film 4 to form a pattern of oxidation resistant masking film made of the silicon nitride film 4.

Next, as shown in FIG. 1B, a second photo-resist film 6 is applied on the whole surface, then the film 6 is exposed with a mask for preparing a channel stopper. Then the exposed film is developed. With this process, there is made left a portion with the second photo-resist film 6 selectively above and in the vicinity of the n-well 2 alone. With the first photo-resist film sections 5a and 5b and the second photo-resist film 6 as the mask, a p-type impurity is ion-implanted onto the surface of the substrate 1 to selectively form a p-type ion implanted layer 7.

Subsequently, as shown in FIG. 1C and FIG. 2, after the first photo-resist film 5 (5a, 5b and 5c) and the second photo resist film 6 are removed, the surface of the substrate 1 masked by the silicon nitride film 4 is subjected to a thermal oxidation process. By this process, field oxide layers 8 (element separation insulating layers) are selectively formed on the surface of the substrate 1. Upon the thermal oxidation process, the impurity in the p-type ion implanted layer 7 are diffused to form a p-type channel stopper 9 under field oxide layer 8. After the completion of this process, the silicon nitride film 4 is removed.

In this manner stated above, there are provided a p-MOS transistor forming region 10, a n-MOS transistor forming region 11 and a narrow-channel MOS transistor forming region 12 each of which is separated by the field oxide layers 8. The procedure above is described in a case of the LOCOS method. In a case of the LOPOS method, the same procedure as in FIG. 1 is effected except that a step is added in which a polycrystalline silicon film is grown below the silicon nitride film.

FIG. 2 is a plan view corresponding to FIG. 1C. Here, a gate electrode 13 is referentially shown only for the narrow-channel n-MOS transistor by an alternate long and two short dashes line, and the region of the channel stopper 9 is shown by hatching.

Normally, the channel stopper 9 is shaped substantially similar to the field oxide layers 8. In some cases, however, as shown in FIG. 2, depending upon the conditions of the ion implantation and the thermal oxidation, the channel stopper 9 may be formed spreading into the n-MOS transistor forming region 11 and narrow-channel n-MOS transistor forming region 12.

However, in a case where a narrow-channel transistor is prepared by the conventional preparation process of a semiconductor device, the smallness of the channel width and the possible spreading of the channel stopper 9 due to various factors may cause the effective channel width to be decreased and substantially eliminated in the worst case.

The simplest solution of this problem is to set up a margin for the channel width of the narrow-channel MOS transistor forming region 12. In such case, there may be two methods, one of which is to evaluate a decrease of the channel width due to the channel stopper 9 and design the forming region 12 of the narrow-channel MOS transistor to be larger by taking a margin for making up for it. The other method is to design a transistor having as large a channel width as the decrease of the channel width does not cause any problem. In the first method, however, there is a difficulty that characteristics of the narrow-channel transistors vary widely due to the fluctuation of the process. On the other hand, the second method has a drawback that the occupying area of the narrow-channel transistor happens to be increased.

SUMMARY OF THE INVENTION

It is an object of the present invention to provide a process for preparing a semiconductor device, the method whereby the diffusion layer of the channel stopper is prevented from spreading into the channel of a narrow-channel MOS transistor and reducing the channel width thereof, and whereby the dispersion of characteristics and an augment of the occupying area of the narrow-channel transistor can be prevented.

In the process for preparing a semiconductor device including a narrow-channel MOS transistor according to the present invention, an oxidation resistant masking film is grown on one conduction-type semiconductor region of the surface of a semiconductor substrate, then masking film for field-forming is selectively formed on said oxidation resistant masking film. Thereafter, the oxidation resistant masking film is selectively removed using the masking film for field-forming as the mask.

After the above process, a masking film for ion implantation is selectively formed such as to be larger, at least in a region in which a narrow-channel MOS transistor is to be formed, than an overlapping region between the masking film for field-forming and the designed gate electrode forming region of the narrow-channel MOS transistor and completely cover up the overlapping region.

Then, impurity ions having the same conduction-type with that of said one conduction-type semiconductor region are implanted self-conformably onto the surface of the semiconductor substrate other than the regions covered by both the masking film for field-forming and the masking film for ion implantation. After the ion implantation, the making film for field-forming and the masking film for ion implantation are removed. Then the substrate is subjected to heating self-conformably with said oxidation resistant mask film to form field oxide layers selectively for partitioning the element forming regions.

In the present invention, the ion implantation process is executed after the masking film for ion implantation is formed on the resist film for forming oxidation resistant mask such that it is larger than the overlapping region between the resist film for forming oxidation resistant mask and the designed region for forming a gate electrode and covers up the overlapping region. With this, the channel stopper can be formed outside at least the channel region of the narrow-channel MOS transistor, so that the diffusion layer of the channel stopper from spreading into the channel can be inhibited a nd the reduction of the channel width of the narrow-channel MOS transistor can be prevented.

BRIEF DESCRIPTION OF THE DRAWINGS

FIG. 2 is a plan view of the step shown in FIG. 1C;

FIG. 4 is a plan view of the step shown in FIG. 3C; and

FIG. 5 is a plan view showing a modification example of an embodiment of the present invention.

DESCRIPTION OF THE PREFERRED EMBODIMENTS

Referring now to the accompanying drawings, embodiments of the present invention will be described.

Figure 3A:
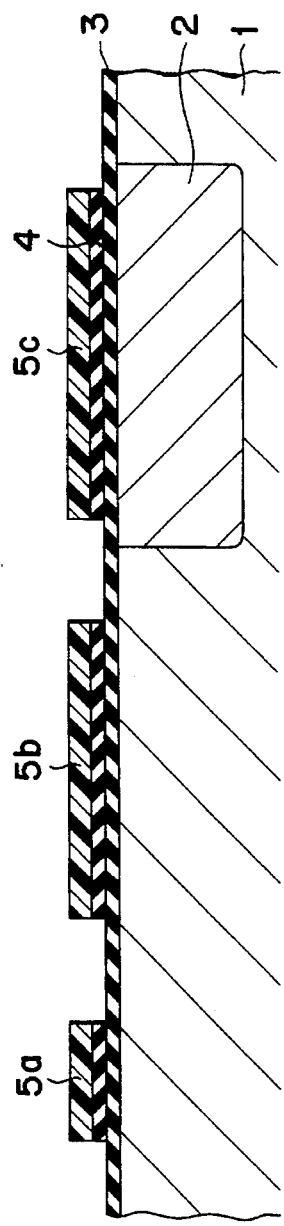
FIGS. 3A to 3C are sectional views showing a process for preparing a semiconductor device in the order of the process steps in accordance with a first embodiment of the present invention.
Figure 3B:
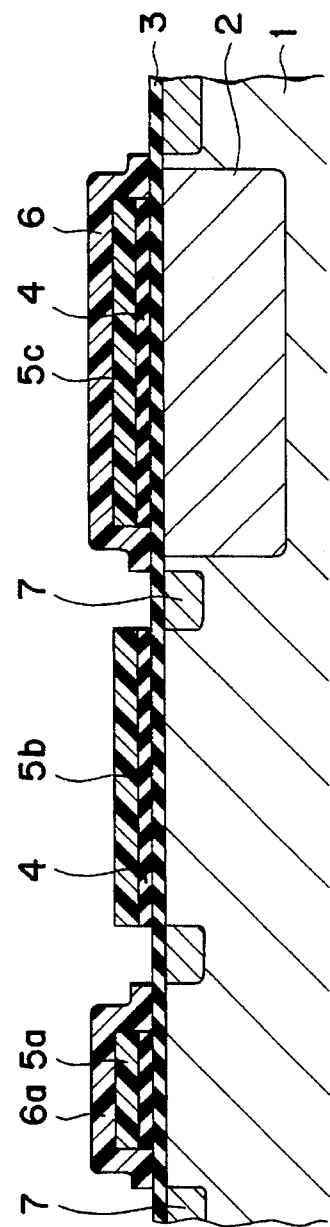
Figure 3C:
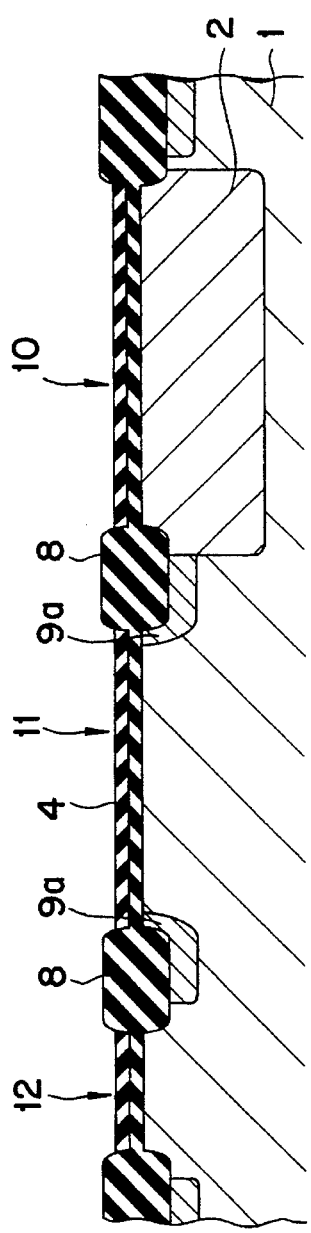

FIGS. 3A to 3C are sectional views showing a process for preparing a semiconductor device in the order of the process steps in accordance with an embodiment of the present invention and FIG. 4 is a plan view corresponding to FIG. 3C. In FIG. 4, a second photo-resist film 6a and a gate electrode 13 only for the narrow-channel n-MOS transistor are referentially shown by an alternate long and short dash line, and an alternate long and two short dashes line, respectively. In FIG. 4, a broken line indicates the boundary of a channel stopper 9a and hatching shows the area of the channel stopper 9a.

Figure 1A:
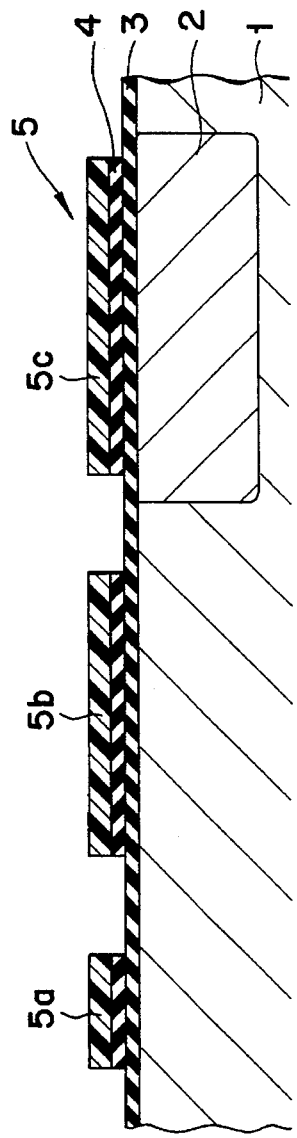
FIGS. 1A through 1C are sectional views showing a conventional process for preparing a semiconductor device in the order of the process steps.
Figure 1B:
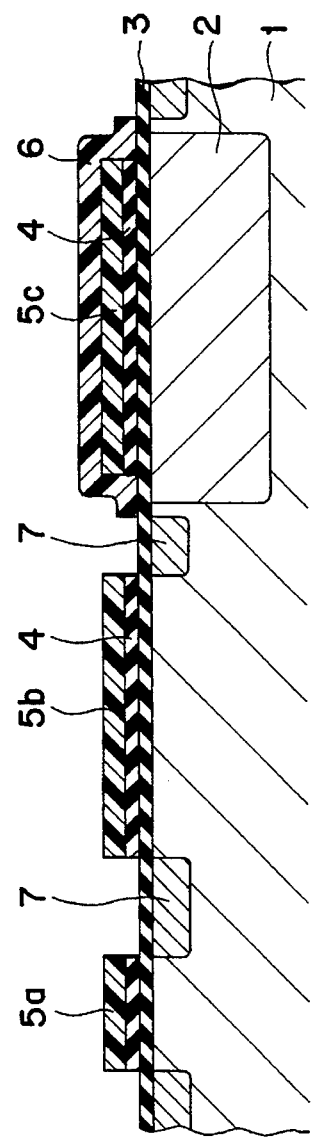
Figure 1C:
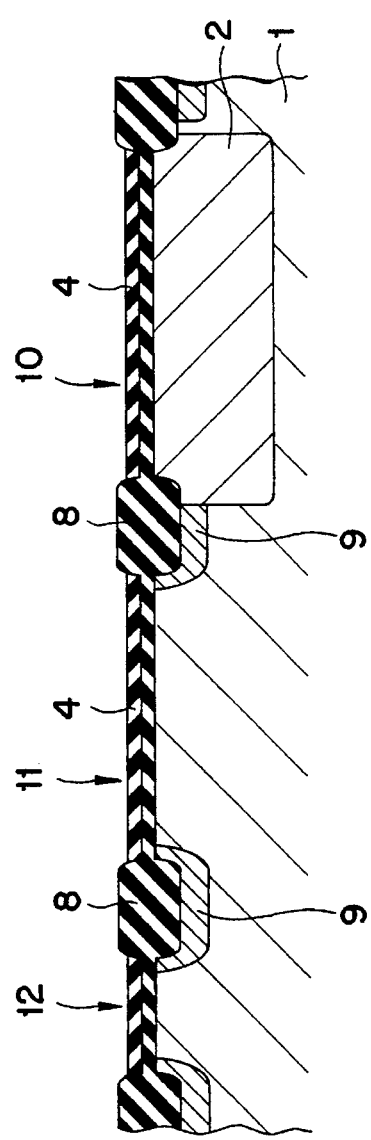

A step shown in FIG. 3A is the same process shown in FIG. 1A. That is, in this embodiment, the steps up to the preparation of first photo-resist film sections 5a, 5b and 5c (masking films for field-forming) are the same with the conventional process.

As shown in FIG. 3B, in the method of this embodiment, a second photo-resist film 6 is applied on the whole face, the second photo-resist film 6 is selectively exposed and developed in predetermined area so that the second photo-resist film sections 6a and 6 on the first photo-resist film sections 5a and 5c are made left as a masking film for ion implantation.

The first photo-resist film section 5a is an etching mask for forming a narrow-channel n-MOS transistor forming region 12 (see FIG. 4), and the shape in plan is rectangle. All the rectangular first photo-resist film section 5a other than both ends thereof as well as the sides of the silicon nitride film 4 therebeneath are cove covered up by the second photo-resist film 6a (the masking film for ion implantation).

Then, the surface of the substrate 1 masked by the second photo-resist film sections 6 and 6a is implanted with boron ions to selectively form a p-type ion implanted layer 7 on the surface of the substrate 1. Thereafter, the first photo-resist film 5a, 5b and 5c and the second photo-resist film 6 and 6a are removed.

After the removal, a thermal oxidation process is effected. This thermal oxidation forms, as shown in FIG. 3C and FIG. 4, field oxide layers 8 and channel stopper 9a selectively on the surface of the substrate 1. Thus a p-MOS transistor forming region 10, an n-MOS transistor forming region 11 and a narrow-channel n-MOS transistor forming region 12 ace partitioned by the field oxide layers.

Next, as shown in FIG. 4, a gate electrode 13 is formed in a predetermined pattern. Here in FIG. 4, no gate electrodes are shown for simplicity for the p-MOS transistor forming region 10 and n-MOS transistor forming region 11.

In this embodiment, the size and shape of the second photo-resist film 6a is decided such that, as shown in FIG. 4, under the gate electrode 13 the channel stopper 9a is located by a certain distance away from the narrow-channel n-MOS transistor region 12 (i.e. the channel region). Further the dimension of the second photo-resist film 6a is to be designed under consideration of the displacement brought about by the heat treatment and the misregistration in forming the second photo-resist film 6a. With this, it is possible to prevent the channel stopper 9a in the area immediately under the gate electrode 13 from intruding into the narrow-channel n-MOS transistor forming region 12.

Thus, according to the present invention, it is possible to form narrow-channel MOS transistors having less deviations from the specification without augment of the occupying area, by the process used to be effected without adding any special step.

In the embodiment above-described, the channel stopper 9a is formed outside the channel region, it is possible, as shown in FIG. 5, that a channel stopper 9b is formed outside the narrow-channel MOS transistor forming region 12. The channel stopper 9b may be formed by providing a masking film for ion implantation larger than and covering up the masking film for forming the field oxide film.

What is claimed is:

1. A process for preparing a semiconductor device with a narrow-channel MOS transistor and a normal channel MOS transistor, said narrow-channel MOS transistor having a channel region narrower than a channel region of said normal-channel MOS transistor, comprising the steps of:

forming an oxidation resistant masking film on a semiconductor region of the surface of a semiconductor substrate;

forming a masking film for field-forming selectively on said oxidation resistant masking film;

removing said oxidation resistant masking film selectively using said masking film for field-forming as a mask;

forming selectively a masking film for ion implantation, said masking film for implantation being larger, at least in a region in which the narrow-channel MOS transistor is to be formed, than an overlap region between said masking film for field-forming and a portion of said semiconductor region and completely covering up said overlap region;

implanting impurity ions having the same conduction-type with that of said semiconductor region into the region of the surface of the semiconductor substrate other than the regions covered by both said masking film for field-forming and said masking film for ion implantation by self-align method;

removing said masking film for field-forming and said masking film for ion implantation; and forming field oxide layers selectively by heat-treating self-aligned with said oxidation resistant masking film to partition element forming regions.

2. A process for preparing a semiconductor device with a narrow-channel MOS transistor according to claim 1, wherein said one conduction- type is p-type.

3. A process for preparing a semiconductor device with a narrow-channel MOS transistor according to claim 1 or 2, wherein said oxidation resistant masking film is composed of silicon nitride film, and said masking film for field-forming and said masking film for ion implantation are resist films.

4. A process for preparing a semiconductor device with a narrow-channel MOS transistor and a normal channel MOS transistor, said narrow-channel MOS transistor having a channel region narrower than a channel region of said normal-channel MOS transistor, comprising the steps of:

preparing one conduction-type semiconductor regions and the other conduction-type semiconductor regions on the surface of a semiconductor substrate;

growing an oxidation resistant masking film on the entire surface of said semiconductor substrate;

forming masking film for field-forming selectively on said oxidation resistant masking film;

removing said oxidation resistant masking film selectively from the region except the area in which elements are to be formed in said one conduction-type semiconductor region and the other conduction-type semiconductor region, using said masking film for field-forming as a mask;

forming masking film for ion implantation on a region, larger than and completely covering up, an overlap between said masking film for field-forming in the region in which said narrow-channel MOS transistor is to be formed and the designed gate electrode forming region of said narrow-channel MOS transistor as well as a region larger than said masking film for field-forming and oxidation resistant masking film on said the other conduction-type semiconductor region;

implanting impurity ions having the same conduction-type with that of said one conduction-type semiconductor region into the region of the surface of the semiconductor substrate other than the regions covered by both said masking film for field-forming and said masking film for ion implantation by self-align method;

removing said masking film for field-forming and said masking film for ion implantation; and forming field oxide layers selectively by heat-treating self-aligned with said oxidation resistant masking film to partition element forming regions.

5. A process for preparing a semiconductor device with a narrow-channel MOS transistor and a normal channel MOS transistor, said narrow-channel MOS transistor having a channel region narrower that a channel region of said normal-channel MOS transistor, comprising the steps of:

preparing one conduction-type semiconductor region and the other conduction-type semiconductor regions on the surface of a semiconductor substrate;

growing an oxidation resistant masking film on the entire surface of said semiconductor substrate;

forming masking film for field-forming selectively on said oxidation resistant masking film;

removing said oxidation resistant masking film selectively from the region except the area in which elements are to be formed in said one conduction-type semiconductor region and the other conduction-type semiconductor region, using said masking film for field-forming as a mask;

forming masking film for ion implantation on a region larger than, and completely covering up the masking film for field-forming in a region in which said narrow-channel MOS transistor is to be formed as well as a region larger than and completely covering up the masking film for field-forming and the oxidation resistant masking film on said the other conduction-type semiconductor region;

implanting impurity ions having the same conduction-type with said one conduction-type semiconductor into the region of the surface of the semiconductor substrate other than the regions covered by both said masking film for field-forming and said masking film for ion implantation by self-align method;

removing said masking film for field-forming and said masking film for ion implantation; and forming field oxide layers selectively by heat-treating self-aligned with said oxidation resistant masking film to partition element forming regions.

* * * * *